(12) United States Patent
Nath et al.

(10) Patent No.: US 9,831,540 B2
(45) Date of Patent: Nov. 28, 2017

(54) SYSTEMS AND METHODS FOR IMPROVED CHIP DEVICE PERFORMANCE

(75) Inventors: Jayesh Nath, Santa Clara, CA (US); Ying Shen, Chapel Hill, NC (US)

(73) Assignee: Aviat U.S., Inc., Milpitas, CA (US)

( * ) Notice: Subject to any disclaimer, the term of this patent is extended or adjusted under 35 U.S.C. 154(b) by 0 days.

(21) Appl. No.: 13/250,654

(22) Filed: Sep. 30, 2011

(65) Prior Publication Data

US 2012/0113615 A1     May 10, 2012

Related U.S. Application Data

(60) Provisional application No. 61/388,493, filed on Sep. 30, 2010.

(51) Int. Cl.
    *H01L 23/66*     (2006.01)
    *H01P 3/08*     (2006.01)
    *H01L 23/48*     (2006.01)

(52) U.S. Cl.
CPC ............ *H01P 3/081* (2013.01); *H01L 23/481* (2013.01); *H01L 23/66* (2013.01); *H01L 2223/6616* (2013.01); *H01L 2223/6627* (2013.01); *H01L 2223/6683* (2013.01); *H01L 2924/0002* (2013.01); *Y10T 29/49155* (2015.01)

(58) Field of Classification Search
CPC ........ H01P 3/081; H01L 23/481; H01L 23/66; H01L 2223/6616; H01L 2223/6627
USPC ............................................ 257/774; 333/33
See application file for complete search history.

(56) References Cited

U.S. PATENT DOCUMENTS

| | | | |
|---|---|---|---|
| 6,046,499 A * | 4/2000 | Yano et al. ................... | 257/712 |
| 6,388,208 B1 * | 5/2002 | Kiani et al. .................. | 174/266 |
| 6,664,935 B1 | 12/2003 | Thompson et al. | |
| 6,856,210 B2 * | 2/2005 | Zhu et al. ....................... | 333/33 |
| 7,045,719 B1 * | 5/2006 | Alexander et al. ........... | 174/262 |
| 7,088,711 B2 | 8/2006 | Goergen | |
| 7,271,681 B2 | 9/2007 | Dyckman et al. | |
| 7,435,912 B1 * | 10/2008 | Alexander et al. ........... | 174/262 |
| 7,676,919 B2 * | 3/2010 | Zhao et al. ..................... | 29/852 |
| 7,897,880 B1 * | 3/2011 | Goergen et al. .............. | 174/262 |
| 7,968,802 B2 * | 6/2011 | Pai et al. ....................... | 174/262 |

(Continued)

OTHER PUBLICATIONS

International Application No. PCT/US2011/054339, International Search Report and Written Opinion dated Jan. 20, 2012.

(Continued)

*Primary Examiner* — Bitew Dinke
(74) *Attorney, Agent, or Firm* — Sheppard, Mullin, Richter & Hampton LLP

(57) ABSTRACT

Systems and methods for improved chip device performance are discussed herein. An exemplary chip device for use in an integrated circuit comprises a bottom and a top opposite the bottom. The chip device comprises a through-chip device interconnect and a clearance region. The through-chip device interconnect is configured to provide an electrical connection between a ground plane trace on the bottom and a chip device path on the top of the chip device. The clearance region on the bottom of the chip device comprises an electrically conductive substance. The size and shape of the clearance region assists in impedance matching. The chip device path on the top of the chip device may further comprise at least one tuning stub. The size and shape of the at least one tuning stub also assists in impedance matching.

20 Claims, 11 Drawing Sheets

(56) References Cited

U.S. PATENT DOCUMENTS

| | | | |
|---|---|---|---|
| 8,058,956 B2* | 11/2011 | Jow et al. | 333/260 |
| RE44,586 E * | 11/2013 | Hsu et al. | 174/262 |
| 2001/0029065 A1* | 10/2001 | Fischer et al. | 438/115 |
| 2001/0054939 A1* | 12/2001 | Zhu et al. | 333/33 |
| 2002/0179332 A1* | 12/2002 | Uematsu et al. | 174/262 |
| 2005/0057402 A1* | 3/2005 | Ohno et al. | 343/700 MS |
| 2006/0258187 A1* | 11/2006 | Behziz | 439/77 |
| 2007/0008049 A1* | 1/2007 | Dyckman et al. | 333/33 |
| 2007/0193775 A1* | 8/2007 | Chen et al. | 174/262 |
| 2007/0194431 A1* | 8/2007 | Corisis | H01L 23/66 257/698 |
| 2007/0205847 A1* | 9/2007 | Kushta et al. | 333/33 |
| 2007/0268088 A1* | 11/2007 | Singh | 333/33 |
| 2008/0075070 A1* | 3/2008 | Goergen | 370/360 |
| 2008/0150585 A1 | 6/2008 | Warner et al. | |
| 2008/0251288 A1* | 10/2008 | Yamashita et al. | 174/262 |
| 2009/0057912 A1* | 3/2009 | Kheng | H05K 3/4602 257/774 |
| 2011/0079422 A1* | 4/2011 | Kushita et al. | 174/266 |
| 2011/0215882 A1* | 9/2011 | Cornic et al. | 333/136 |
| 2011/0217853 A1* | 9/2011 | Cornic | H01P 5/085 439/63 |
| 2011/0248800 A1* | 10/2011 | Kushta | 333/204 |
| 2011/0267152 A1* | 11/2011 | Lee | H01P 5/103 333/26 |
| 2012/0013421 A1* | 1/2012 | Hayata | 333/239 |
| 2012/0153495 A1* | 6/2012 | Mallik et al. | 257/774 |

OTHER PUBLICATIONS

Rapoport, Nahum, "Leadless Ceramic SMT Substrates and Packages from DC to 30 GHz," 2008 IEEE MTT-S International Microwave Symposium, Jun. 15-20, 2008.

* cited by examiner

SYSTEMS AND METHODS FOR IMPROVED CHIP DEVICE PERFORMANCE

CROSS-REFERENCE TO RELATED APPLICATIONS

The present application claims benefit of U.S. Provisional Patent Application No. 61/388,493 filed Sep. 30, 2010, and entitled "Low Cost SMT Package for Microwave Systems and Sub-systems and Methodology for Optimizing its Electrical Performance" which is incorporated by reference herein.

BACKGROUND

1. Field of the Invention(s)

The present invention(s) generally relate to chip performance. More particularly, the invention(s) relate to systems and methods for improvement of a frequency response of a chip device.

2. Description of Related Art

Various chip-and-wire methods are commonly used to make monolithic microwave integrated circuits (MMICs). A monolithic microwave integrated circuit is a type of integrated circuit device that operates at microwave frequencies. Examples of functions of integrated circuit devices include microwave mixing, power amplification, low noise amplification, and high frequency switching.

Common chip-and-wire MMIC module assembly approaches often used in today's microwave radios include traditional multiple thin film modules, hybrid PCB with thin-film modules, hybrid PCB with MMIC modules, and single carrier multi MMIC modules. In all of these approaches, one of the most common disadvantages is that the final module assembly requires traditional chip-and-wire operations. The traditional microwave and millimeter wave chip-and-wire process is an obstacle to today's CM (Contract Manufacturing) high volume and low cost production goals.

Although some voltage controlled oscillator (VCO) modules and hybrid MMIC assemblies may be used in the frequency range of 0.5 to 8 GHz for input and output ports with several DC feed lines, these components may become unusable at higher frequencies due to signal degradation.

SUMMARY OF THE INVENTION

Systems and methods for improved chip device performance are discussed herein. An exemplary chip device for use in an integrated circuit comprises a bottom and a top opposite the bottom. The exemplary chip device comprises a through-chip device interconnect and a clearance region. The through-chip device interconnect is configured to provide an electrical connection between a ground plane trace on the bottom and a chip device path on the top of the chip device. The clearance region on the bottom of the chip device comprises an electrically conductive substance. The size and shape of the clearance region may assist in impedance matching. The chip device path on the top of the chip device may further comprise at least one tuning stub. The size and shape of the at least one tuning stub also assists in impedance matching.

The shape of the clearance region may be circular or ovoid. The through-chip interconnection may comprise a pass-through via. In some embodiments, the chip device may comprise an alumina package.

Another exemplary chip device comprises a bottom and a top opposite the bottom. The exemplary chip device comprises a through-chip device interconnect configured to provide an electrical connection between a ground plane trace on the bottom and a chip device path on the top of the chip device. The chip device path on the top of the chip device may further comprise at least one tuning stub. The size and shape of the at least one tuning stub may assist in impedance matching.

An exemplary method may comprise providing a chip device comprising a bottom and a top opposite the bottom, forming a through-chip device interconnect configured to allow electrical communication between the bottom of the chip device and the top of the chip device, creating a chip device path on the top of the chip device that is electrically coupled to the through-chip device interconnection, and forming a clearance region on the bottom of the chip device, the clearance region comprising an electrically conductive substance and is electrically coupled to the through-chip device interconnection, a size and shape of the clearance region configured to assist in impedance matching.

The method may further comprise designing the clearance region to assist in impedance matching. Designing the clearance region to assist in impedance matching may comprise simulating an effect of the size and shape of the clearance region and assessing a simulated frequency response from the simulation.

The clearance region may be formed before the chip device path is created. In some embodiments, creating the chip device path on the top of the chip device may comprise forming at least one tuning stub within the chip device path, the at least one tuning stub comprising an electrically conductive substance, a size and shape of the at least one tuning stub configured to assist in impedance matching.

Another exemplary method comprises providing a chip device comprising a bottom and a top opposite the bottom, forming a through-chip device interconnect configured to allow electrical communication between the bottom of the chip device and the top of the chip device, creating a chip device path on the top of the chip device that is electrically coupled to the through-chip device interconnection, and forming at least one tuning stub of the chip device path, the at least one tuning stub comprising an electrically conductive substance, a size and shape of the at least one tuning stub configured to assist in impedance matching.

In some embodiments, the method further comprises designing the at least one tuning stub to assist in impedance matching. Designing the at least one tuning stub to assist in impedance matching may comprise simulating an effect of the size and shape of the clearance region and assessing a simulated frequency response from the simulation.

The at least one tuning stub may be formed approximately when the chip device path is created. In some embodiments, the method may further comprise forming a clearance region on the bottom of the chip device. The clearance region may comprise an electrically conductive substance electrically coupled to the through-chip device interconnection. The size and shape of the clearance region may be configured to assist in impedance matching.

A further exemplary method may comprise receiving a signal from a ground plane trace by a clearance region on a bottom of a chip device, the clearance region assisting in impedance matching of all or part of circuitry coupled to the ground plane trace and all or part of the chip device, the clearance region comprising an electrically conductive substance, a size and shape of the clearance region assisting in impedance matching, passing the signal from the clearance region through a through-chip device interconnect to a chip device path on top of the chip device, the top of the chip device being opposite of the bottom, and providing the signal from the chip device path to one or more components of the chip device. The chip device path may comprise at least one tuning stub. The at least one tuning stub may comprise an electrically conductive substance. The size and shape of the at least one tuning stub may be configured to assist in impedance matching.

Another exemplary method comprises receiving a signal from a ground plane trace by a through-chip device interconnection, the through-chip device interconnect electrically coupled to a bottom of a chip device and a top of the chip device, passing the signal through the through-chip device interconnect to the top of the chip device, receiving the signal from the through-chip device interconnect by a chip device path on the top of the chip device, the chip device path comprising at least one tuning stub comprising an electrically conductive substance, a size and shape of the at least one tuning stub configured to assist in impedance matching, and providing the signal from the chip device path to one or more components of the chip device.

In some embodiments, receiving the signal from the ground plane trace by a through-chip device interconnect may comprise receiving the signal from the ground plane trace by a clearance region on the bottom of a chip device. The clearance region may be electrically coupled to the through-chip device interconnection. The clearance region may assist in impedance matching of all or part of circuitry coupled to the ground plane trace and all or part of the chip device. The clearance region may comprise an electrically conductive substance. The size and shape of the clearance region may assist in impedance matching.

DETAILED DESCRIPTION OF THE INVENTION

There are many different methods to prepare and integrate electrical components within a semiconductor. Different methods impact performance characteristics, cost, and time for fabrication requirements. Unfortunately, some cheaper methods of circuit fabrication limit the performance of the circuit and, as such, render the circuit unsuitable for high frequency signals.

Circuitry fabricated using a chip and wire method may process high frequency signals. A chip and wire method is a method of construction for smaller size circuits with high performance. This assembly technique uses discrete wires to interconnect a backbonding die to lands, lead frames, and the like. These discrete wires and dies are laid down sequentially in an assembly line fashion. Unfortunately, the cost of the chip and wire method is high because of the high level of skill required to produce components using the method.

As discussed herein, the chip and wire method requires high volume in order to obtain efficiencies of scale to reduce cost. Alternate methods include a package in a plastic carrier which may then be mounted to a printed circuit board (PCB) with a surface mount approach. Other processes include a hybrid PCB and chip and wire process where some parts are surface mounted and other parts are integrated using the chip and wire approach.

It may be preferable to utilize packages to avoid the chip and wire method for circuit design. Unfortunately, devices within a plastic or molded package often have degraded performance caused by the added enclosure. This degradation may increase as the frequency of the signal to be processed increases. One example of degradation is senility which is loss of signal, distortion, and/or amplitude of the signal.

In some embodiments, a methodology for fabricating high performance low-cost custom packages for microwave radio systems and sub-systems is described. In one example, a methodology for tuning the frequency response of the input and output ports of such a package is discussed herein.

In various embodiments, various tuning elements may be implemented within a low cost carrier to reduce signal degradation. As such, lower cost methods may be used to produce high frequency components. For example, a low cost carrier such as alumina and a reflow process may be used (which avoids an expensive epoxy-based process) in conjunction with one or more tuning elements to produce high frequency components. In contrast, the input and output ports in prior art devices may not have tuning features for return loss tuning. In various embodiments, tuning features become increasingly important at higher frequencies where the frequency response is to be optimized or improved for performance.

Figure 1:
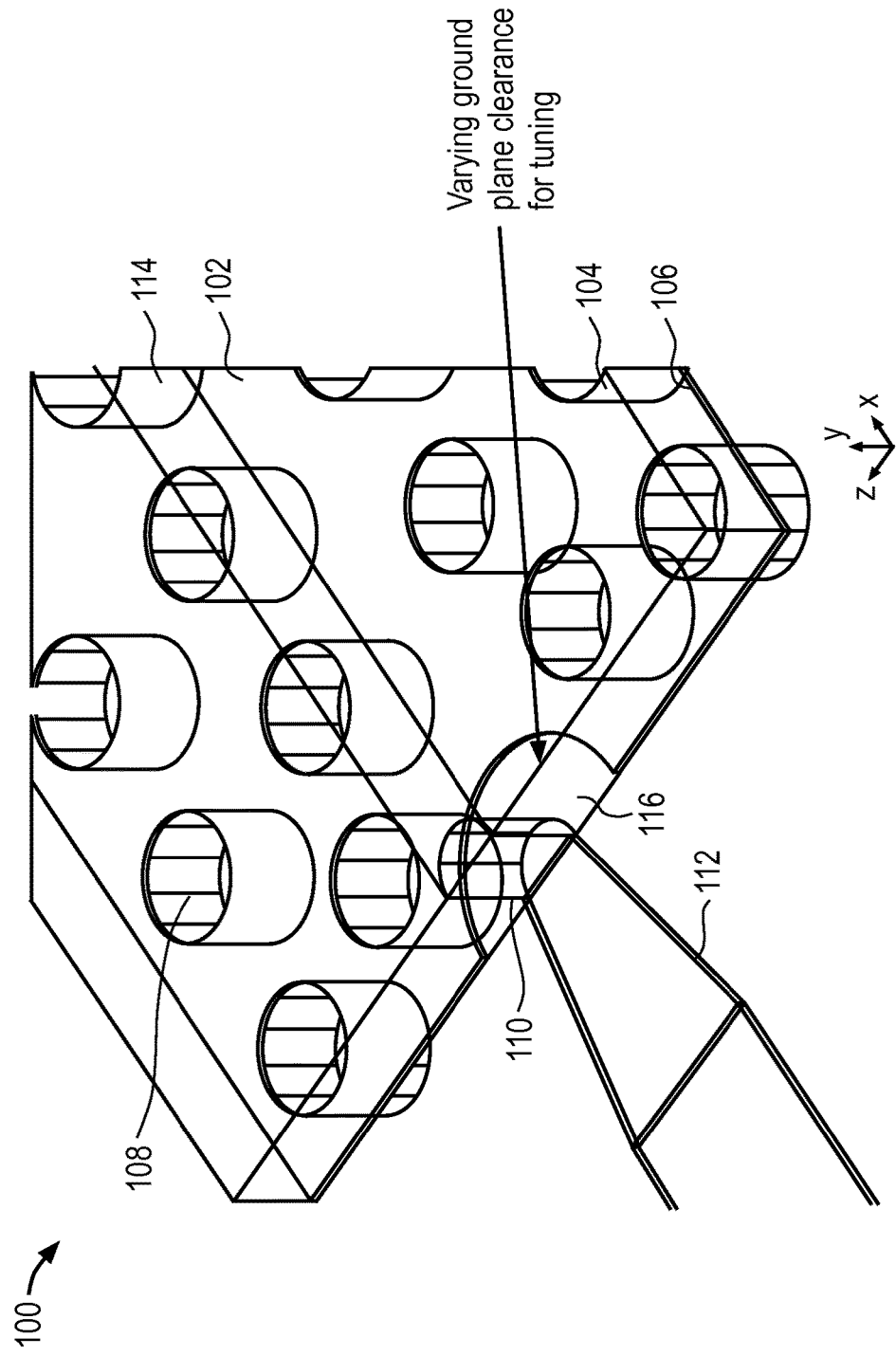
FIG. 1 is an exemplary environment of a chip device including a clearance region tuning element in some embodiments.

FIG. 1 is an exemplary environment 100 of a chip device 102 including a clearance region 116 tuning element in some embodiments. The chip device 102 may comprise a top 104 that is opposite a bottom 106, one or more ground vias 108, and a through-chip device interconnect 110 which is coupled to a ground plane trace 112 and a chip device path 114. The chip device 102 may also comprise a tuning element such as a clearance region 116.

In various embodiments, the chip device 102 may comprise one or more different tuning features. A tuning feature is an element with capacitance and/or inductance that may affect electrical properties of one or more aspects of the chip device 102.

One or more tuning features may extend the frequency range of the chip device 102. As such, less expensive hybrid PCB and chip and wire processes and/or surface mount processes may be utilized with reduced or no signal degradation. As a result, the less expensive circuit may process higher frequency signals. In some embodiments, the tuning elements allow for the manufacture of cost effective microwave radios.

Those skilled in the art will appreciate that tuning elements may be designed to optimize and/or improve performance of the chip device 102. For example, even if a circuit may process high frequency signals, the electrical properties of the circuit may still impact performance due to impedance mismatch. Tuning elements may be designed to eliminate or reduce impedance mismatch to improve performance. In one example, one or more two tuning features available at input and/or output RF ports may allow for optimization of the return loss at one or both of these ports for one or more frequency bands of interest.

Further, those skilled in the art will appreciate that the process of designing tuning elements may ease the process of elimination or reduction of impedance mismatch. For example, once the circuit is modeled with computer-aided design software, the frequency response of one or more aspects of the circuit may be measured with different tuning elements. Further, the frequency response of one or more aspects of the circuit may be measured by varying properties (e.g., size and shape) of a variety of tuning elements.

The chip device 102 may be any computer chip, integrated chip, monolithic integrated chip, or electrical circuit that comprises a top 104 and a bottom 106. The top 104 and bottom 106 may be separated by semiconductor material. The chip device 102 may comprise an alumina package mounted on a PCB and/or be placed within a ceramic carrier. The chip device 102 is electrically coupled to the ground plane trace 112. The chip device 102 may be of any size. In one example, the chip device 102 may comprise a carrier with a height from 5-15 mils. A trace may be from 5-10 mils.

The chip device 102 may comprise a plurality of vias including one or more ground vias 108. Ground vias 108 may include thermal vias configured to carry heat away from one or more components within the chip device 102. A via is a vertical electrical connection between different layers of conductors in a PCB. The bore of the via may be conductive through electroplating. High-density multi-layer PCBs may have microvias.

Those skilled in the art will appreciate that the one or more ground vias 108 may comprise different types of vias including, for example, blind vias or buried vias. Blind vias are exposed only on one side of the board, while buried vias connect internal layers without being exposed on either surface.

The through-chip device interconnect 110 is electrically coupled to the ground plane trace 112 and the chip device path 114. In some embodiments, the through-chip device interconnect 110 is a via allowing electrical connection between the ground plane trace 112, the chip device path 114, and the clearance region 116. Those skilled in the art will appreciate that the through-chip device interconnect 110 may be any electrically conductive path or component configured to electrically couple the ground plane trace 112, the chip device path 114, and the clearance region 116. In some embodiments, the through-chip device interconnect 110 may also electrically couple any number of other components, paths, and/or tuning elements.

The ground plane trace 112 is any wire or path that is electrically coupled to the chip device 102. Although the ground plane trace 112 is identified as being in the "ground plane," those skilled in the art will appreciate that the ground plane trace 112 may not be within a plane or within a "ground plane" of a circuit, rather, the ground plane trace 112 may be electrically coupled to the bottom 106 of the chip device 102. The ground plane trace 112 may be coupled with other components, carriers, systems, and/or subsystems.

Similar to the ground plane trace 112, the chip device path 114 is any wire or path that is electrically coupled with the through-chip interconnect 110 within the chip device 102. Although the chip device path 114 is depicted as being at the top 104 of the chip device 102, the chip device path 114 may be at any layer within the chip device 102 (e.g., of a multi-layer chip device). The chip device path 114 may be coupled with other components, carriers, systems, and/or subsystems.

The clearance region 116 is a semi-circular region comprising an electrical material located at the bottom 106 of the chip device 102. The clearance region 116 comprises any material with electrical properties such as gold, nickel copper, nickel gold, or copper nickel gold that impacts electrical performance of all or part of the chip device 102. The clearance region 116 may be designed to reduce or eliminate impedance mismatch. In some embodiments, the clearance region 116 may have capacitive properties that may be used to tune the performance of the chip device 102.

The size and shape of the clearance region 116 may impact electrical performance. In one example, if the clearance region is circular (as represented by the half-circle clearance region 116), a design that includes an increased proximity of the outer diameter of the clearance region 116 (e.g., the clearance region 116 is smaller) to the through-chip device interconnect 110 and/or the ground plane trace 112 may result in increased capacitance. Similarly, a design that includes a decreased proximity of the outer diameter of the clearance region 116 (e.g., the clearance region 116 is larger) to the through-chip device interconnect 110 and/or the ground plane trace 112 may result in decreased capacitance caused by the clearance region 116. As such, the performance of all or part of the chip device 102 may be improved and/or measured by varying the diameter of ground clearance for return loss tuning.

Those skilled in the art will appreciate that the clearance region 116 may be any size and shape. For example, the clearance region 116 may be circular, ovoid, rectangular, triangular, or any other shape including non-symmetrical shapes. The clearance region 116 may also be of any size. Although FIG. 1 depicts the ground plane trace 112 and the through-chip device interconnect 110 as being within the center of the clearance region 116, the ground plane trace 112 and/or the through-chip device interconnect 110 may be at any location within the chip device 102 that is electrically coupled to the clearance region 116.

In some embodiments, the clearance region 116 may be 5-30 mils in radius from the center. The size and shape of the clearance region 116 may be limited based on physical space on the carrier and/or electrical properties of proximately located components.

Although FIG. 1 depicts the chip device 102 as electrically coupling the ground plane trace 112 at the bottom 106 of the chip device 102 with the chip device path 114 at the top 104 of the chip device 102 via the through-chip interconnect 110, those skilled in the art will appreciate that the circuit may be reversed. For example, a ground plane trace 112 at the top 104 of the chip device 102 may be electrically coupled, via the through-chip device interconnect 110, with a chip device path 114 or other electrical connection at the bottom 106 of the chip device 102. Further, the clearance region 116 may be either at the top 104 or the bottom 106 of the chip device 102.

In various embodiments, tuning features may allow for the design of electrical components capable of performance of up to 50 GHz or more, such as microwave radio subsystems, which are fabricated using surface mount technology (SMT). Further, by allowing the use of surface mount technology in the fabrication of high-frequency components, complete radio systems may be assembled at one contract manufacturer (CM) location since only one technology is involved. Moreover, using the surface mount technology may allow for simpler rework and debugging of radio sub-systems when compared to chip-and-wire fabrication systems and methods.

Further, there may be more competitive pricing from assembly houses due to increased competition. Those skilled in the art will appreciate that there are considerably more CMs doing SMT work than there are CMs doing thin-film or hybrid assembly.

Figure 2:
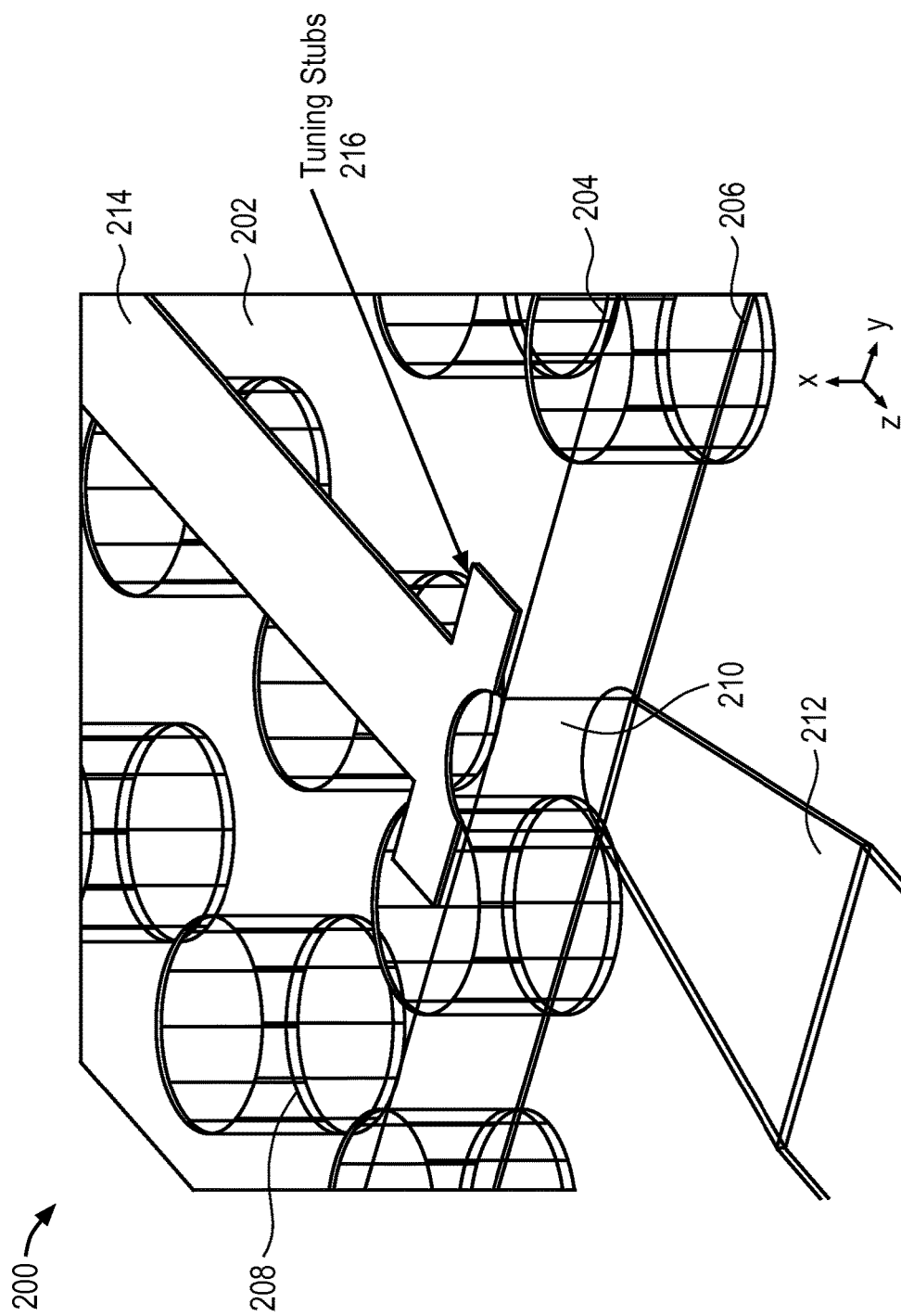
FIG. 2 is an exemplary environment of a chip device including tuning stubs within a chip device path in some embodiments.

FIG. 2 is an exemplary environment 200 of a chip device 202 including tuning stubs 216 within a chip device path 214 in some embodiments. The chip device 202 may comprise a top 204 that is opposite a bottom 206, one or more ground vias 208, and a through-chip device interconnect 210 which is coupled to a ground plane trace 212 and a chip device path 214. The chip device 102 may also comprise a tuning element such as tuning stubs 216.

In various embodiments, the chip device 202 is similar to the chip device 102 and may comprise one or more different tuning features such as tuning stubs 216. The tuning stubs 216, like the clearance region 116 of FIG. 1, may extend the operational frequency range of the chip device 102. Similar to the chip device 102, the chip device 202 may be any computer chip, integrated chip, monolithic integrated chip, or electrical circuit that comprises a top 204 and a bottom 206. The top 204 and bottom 206 may be separated by semiconductor material. The chip device 202 may comprise an alumina package mounted on a PCB and/or be placed within a ceramic carrier. The chip device 202 is electrically coupled to the ground plane trace 212.

The chip device 202 may comprise a plurality of vias including one or more ground vias 208. Like the ground vias 108, the ground vias 208 may include one or more thermal vias. Those skilled in the art will appreciate that the one or more ground vias 208 may comprise different types of vias including, for example, blind vias or buried vias.

Like the through-chip device interconnect 110, the through-chip device interconnect 210 is electrically coupled to the ground plane trace 212 and the chip device path 214. In some embodiments, the through-chip device interconnect 210 is a via or any electrically conductive path or component allowing electrical connection between the ground plane trace 212, the chip device path 214, and the tuning stubs 116. In some embodiments, the through-chip device interconnect 210 may also electrically couple any number of other components, paths, and/or tuning elements.

The ground plane trace 212 is any wire or path that is electrically coupled to the chip device 202. As discussed regarding claim 1, although the ground plane trace 212 is identified as being in the "ground plane," those skilled in the art will appreciate that the ground plane trace 212 may not be within a plane or within a "ground plane" of a circuit, rather, the ground plane trace 212 may be electrically coupled to the top 204 or the bottom 206 of the chip device 202.

Similar to the chip device path 114, the chip device path 214 is any wire or path that is electrically coupled with the through-chip interconnect 210 within the chip device 202. Although the chip device path 214 is depicted as being at the top 204 of the chip device 202, the chip device path 214 may be at any layer within the chip device 202 (e.g., of a multi-layer chip device).

The tuning stubs 216 comprise two rectangular regions electrically coupled to the chip device path 214. The two tuning stubs 216 are symmetrical about that chip device path 214. The tuning stubs 216 comprise any material with electrical properties such as gold, nickel copper, nickel gold, or copper nickel gold that impacts electrical performance of all or part of the chip device 202. The tuning stubs 216 may be designed to reduce or eliminate impedance mismatch. In some embodiments, the tuning stubs 216 may have capacitive and/or inductive properties that may be used to tune the performance of the chip device 202. The tuning stubs 216 may be designed to optimize and/or improve performance of the chip device 102. In one example, the tuning stubs 216 may be designed to reduce impedance mismatch (e.g., matching one interconnect to another interconnect over a frequency range).

The size, shape, location, and number of each tuning stub 216 may impact electrical performance. In one example, each tuning stub 216 is rectangular and extends from the device chip path 214 at the through-chip interconnect 210. The size, shape, location, and number of each of the tuning stubs 216 may affect the capacitive and/or inductive properties of the tuning stubs 216 and, therefore, may affect the performance of all or part of the chip device 202. For example, during design, varying the length and width of one or more tuning stubs 216 may allow for return loss tuning. As such, the performance of all or part of the chip device 102 may be improved and/or measured by varying size, shape, location, and number of tuning stubs 216.

The tuning stubs 216 may be any length or width. In one example, the tuning stubs 216 may be 2-10 mils long and 2-10 mils wide. The length and width of the tuning stubs 216 may be limited based on physical space on the carrier and/or electrical properties of proximately located components.

Those skilled in the art will appreciate that the tuning stubs 216 may be any size and shape. For example, each tuning stub 216 may be rectangular, square, circular, ovoid, or any other shape including non-symmetrical shapes. Although each tuning stub 216 in FIG. 2 is depicted as being the same shape, each tuning stub 216 may of a different shape. Although each tuning stub 216 in FIG. 2 is depicted as being the same size, each tuning stub 216 may of a different size.

Further, the tuning stubs 216 may be located at any position. Although FIG. 2 depicts the through-chip device interconnect 210 as being within a center of the tuning stubs 216, the tuning stubs 216 may not be formed around or at the through-chip device interconnect 210. Those skilled in the art will appreciate that one or more tuning stubs 216 may be formed anywhere on the chip device path 214 and/or top 204 of the chip device 202.

Although two tuning stubs 216 are depicted in FIG. 2, there may be any number of tuning stubs. In one example, there may be only one tuning stub 216 electrically coupled to the chip device path 214. In another example, there may be three or more tuning stubs 216. As discussed herein, each tuning stub 216 may be in a different location than other tuning stubs and each tuning stub 216 may have similar or different sizes and shapes than other tuning stubs 216 on the same chip device 102. Further, although the FIG. 2 depicts two tuning stubs 216 symmetrical to each other, multiple tuning stubs 216 may not be symmetrical and/or symmetrically located.

Although FIG. 2 depicts the chip device 202 is depicted as electrically coupling the ground plane trace 212 at the bottom 206 of the chip device 202 with the chip device path 214 at the top 204 of the chip device 202, those skilled in the art will appreciate that the circuit may be reversed. For example, the ground plane trace 212 at a top 204 of the chip device 202 may be electrically coupled, via the through-chip device interconnect 210, with a chip device path or other electrical connection at the bottom 206 of the chip device 202. Further, the tuning stubs 216 may be either at the top 204 or the bottom 206 of the chip device 202.

Figure 3:
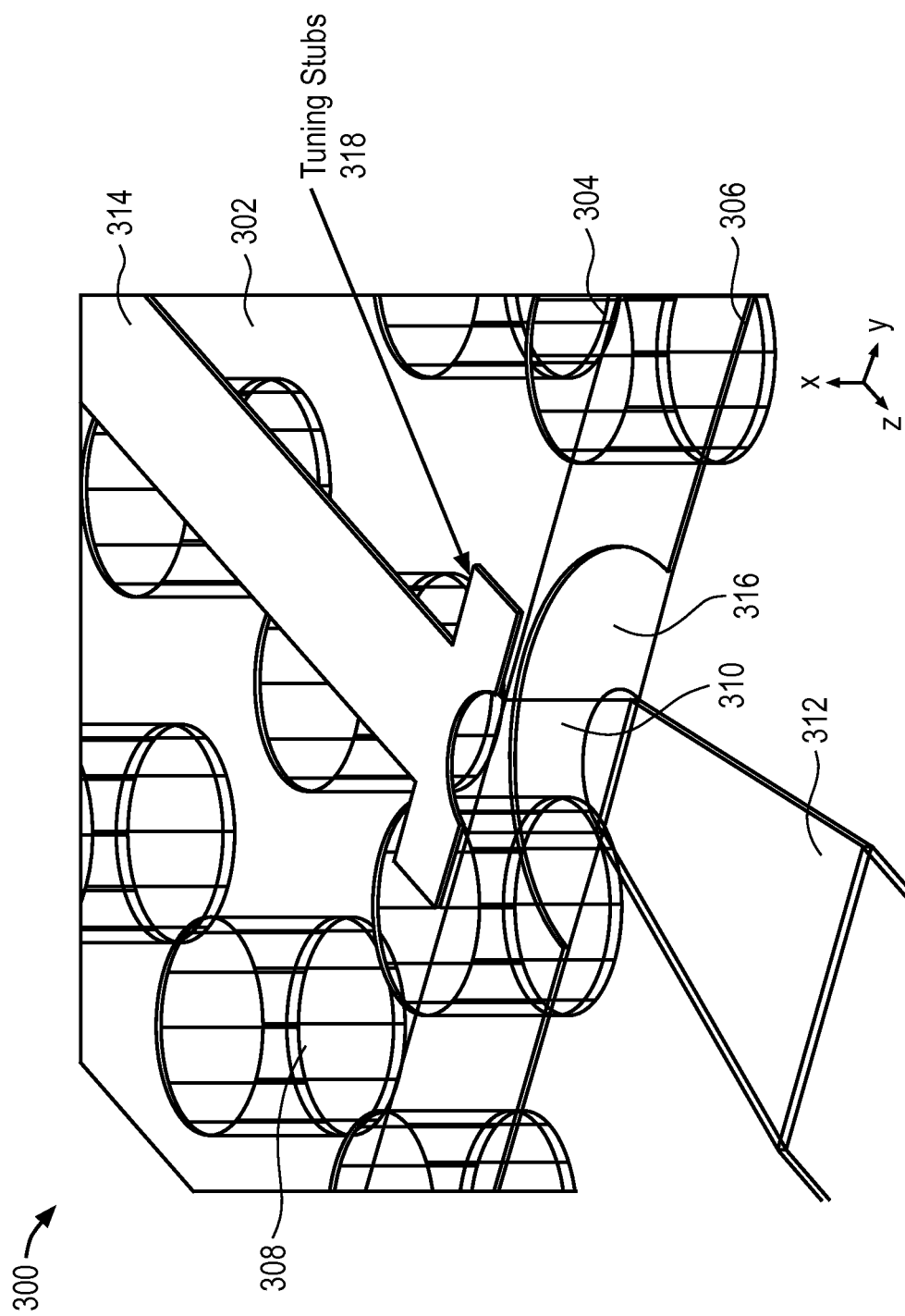
FIG. 3 is an exemplary environment of a chip device including a clearance region and tuning stubs in some embodiments.

FIG. 3 is an exemplary environment 300 of a chip device 302 including a clearance region 316 and tuning stubs 318 in some embodiments. The chip device 302 may be different from the chip devices 102 and 202 in that the chip device 302 may comprise both the clearance region 316 and the tuning stubs 318. The clearance region 316 and tuning stubs 318 may allow for greater design flexibility as well as improved performance. In one example, a designer may have more choices to vary the location, size, shape, and number of tuning elements to improve performance thereby allowing the designer to meet physical and electrical constraints but still achieve a desired performance.

The chip device 302 may comprise a top 304 that is opposite a bottom 306, one or more ground vias 308, and a through-chip device interconnect 310 which is coupled to a ground plane trace 312 and a chip device path 314. The chip device 302 may also comprise tuning elements such as a clearance region 316 and tuning stubs 318.

In various embodiments, the chip device 302 is similar to the chip device 102 and may comprise a combination of different tuning features such as clearance region 316 and tuning stubs 318. The clearance region 316 and the tuning stubs 318, may extend the frequency range of the chip device 302. Similar to the chip device 102, the chip device 302 may be any computer chip, integrated chip, monolithic integrated chip, or electrical circuit that comprises a top 304 and a bottom 306. The top 304 and bottom 306 may be separated by semiconductor material. The chip device 302 may comprise an alumina package mounted on a PCB and/or be placed within a ceramic carrier. The chip device 302 is electrically coupled to the ground plane trace 312.

The chip device 302 may comprise a plurality of vias including one or more ground vias 208. Like the ground vias 108, the ground vias 308 may include one or more thermal vias. Those skilled in the art will appreciate that the one or more ground vias 308 may comprise different types of vias including, for example, blind vias or buried vias.

Like the through-chip device interconnect 110, the through-chip device interconnect 310 is electrically coupled to the ground plane trace 312 and the chip device path 314. In some embodiments, the through-chip device interconnect 310 is a via allowing electrical connection between the ground plane trace 312, the chip device path 314, and the clearance region 316. Those skilled in the art will appreciate that the through-chip device interconnect 110 may be any electrically conductive path or component configured to electrically couple the ground plane trace 312, the chip device path 314, the clearance region 316, and one or more tuning stubs 318. In some embodiments, the through-chip device interconnect 310 may also electrically couple any number of other components, paths, and/or tuning elements.

The ground plane trace 312 is any wire or path that is electrically coupled to the chip device 302. The ground plane trace 312 may be similarly located and have similar properties as the ground plane trace 112 in FIG. 1. Similar to the ground plane trace 312, the chip device path 314 is any wire or path that is electrically coupled with the through-chip interconnect 310 within the chip device 302. The chip device path 314 may be similarly located and have similar properties as the chip device path 114 in FIG. 1.

The clearance region 316 may have similar properties as the clearance region 116. For example, the clearance region 316 comprises any material with electrical properties such as gold, nickel copper, nickel gold, or copper nickel gold that impacts electrical performance of all or part of the chip device 302. The clearance region 316 may be designed to reduce or eliminate impedance mismatch.

The tuning stubs 318 may have similar properties as the tuning stubs 218. For example, like the tuning stubs 218 and the clearance region 116, the tunings tubs may comprise any material with electrical properties such as gold, nickel copper, nickel gold, or copper nickel gold that impacts electrical performance of all or part of the chip device 302.

As discussed regarding FIGS. 1 and 2, the size, shape, and location of the clearance region 316 and the tuning stubs 318 may affect electrical performance. As discussed regarding FIG. 1, the clearance region 316 may be of any size or shape. Further, as discussed regarding FIG. 2, there may be any number of tuning stubs 318. Further, the tuning stubs 318 may be of any size, shape, and/or location.

During design, the size, shape, and location of one or more tuning features may be varied to measure frequency response of all or part of the chip device 102 to improve performance. For example, during design, varying the diameter of ground clearance 316 and the length and width of one or more tuning stubs 318 may allow for return loss tuning. As such, the tuning features may allow for optimization and/or improved performance of the frequency response of the sub-circuit and, by extension, overall radio performance. In another example, varying the diameter of the ground clearance and the length and width of tuning stub may be performed for return loss tuning and for the ability of integrating multiple functionalities in a single SMT package.

In some embodiments, a designer may take a preexisting design and add one or more tuning elements. The designer may then design the tuning elements to tune the chip device 302 or the overall circuit to extend the frequency range.

Systems and methods described herein may provide flexibility, low cost (when compared with off-the-shelf standard MMIC packages), compatibility with CM standard pick and place processes, and/or reduced traditional microwave chip-and-wire operations. Further, systems and methods described herein may provide better system performance by aggregating multiple SMT part functionality into one SMT part.

In some embodiments, a designer may choose to include only a clearance region 316 or tuning stubs 318. In one example, example, a frequency range of 5-10 GHz may be required and, as such, both the clearance region 316 and the tuning stubs 318 are unnecessary. In another example, a frequency range up to 40 GHz may be desired and, as such, the designer may opt to include both the clearance region 316 and the tuning stubs 318.

Figure 4:
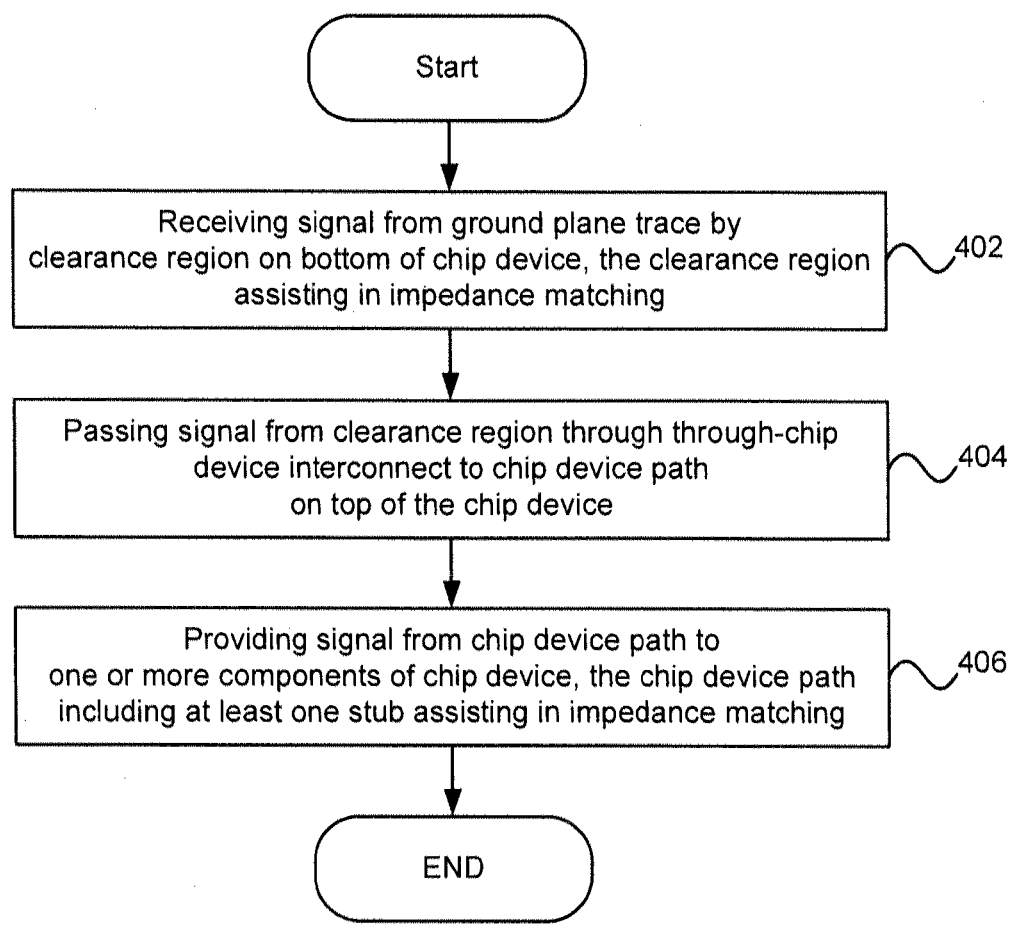
FIG. 4 is an exemplary method for propagating a signal through an exemplary chip device in some embodiments.

FIG. 4 is an exemplary method for propagating a signal through an exemplary chip device in some embodiments. In step 402, the clearance region 316 on the bottom 306 of the chip device 302 receives a signal from the ground plane trace 312. The clearance region 316 is electrically coupled to the ground plane trace 312 and the through-chip interconnect 310. The clearance region 316 assists in impedance matching of all or part of the chip device 302 and/or a larger circuit.

In step 404, the through-chip device interconnect 310 passes the signal from the clearance region 316 to the chip device path 314 at the top 304 of the chip device 302. Those skilled in the art will appreciate that the through-chip device interconnect 310 may be a via or any path that is electrically coupled with the clearance region 316 and the chip device path 314.

In step 406, the chip device path 314 may provide the signal from the through-chip device interconnect 310 to one or more components of the chip device 302. In various embodiments, the chip device path 314 may comprise or be electrically coupled with at least one tuning stub which may assist in impedance matching and/or improved performance of all or part of the chip device 302.

Figure 5:
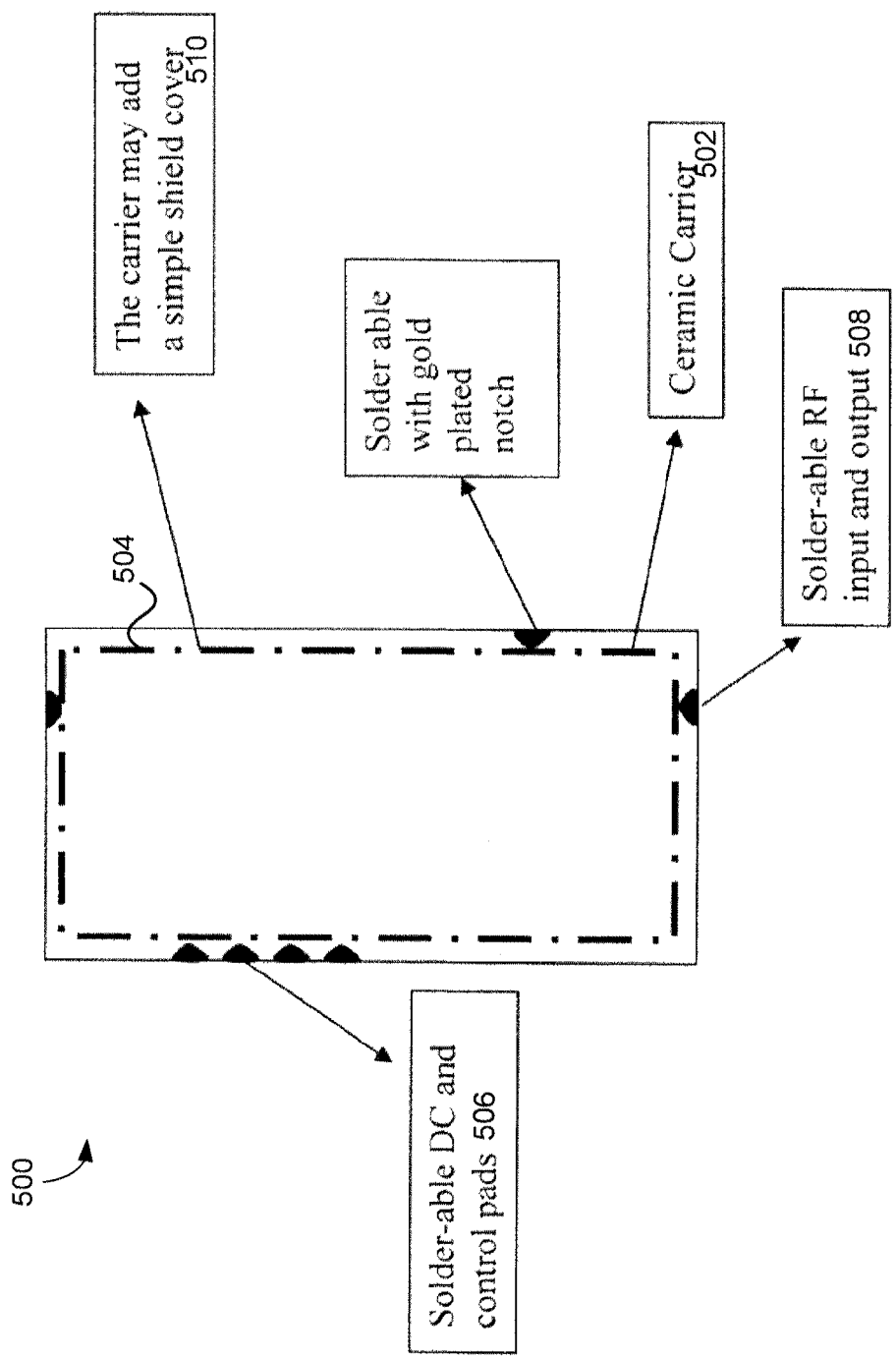
FIG. 5 is an exemplary environment of a ceramic carrier and footprint in some embodiments.

FIG. 5 is an exemplary environment 500 of a ceramic carrier 502 and footprint 504 in some embodiments. In various embodiments, chip-and-wire methodologies for chip fabrication may be eliminated or reduced. In one example, through the use of tuning chip devices, such as the clearance region and/or tuning stubs as discussed herein, chip-and-wire operations may be reduced. The exemplary environment 500 depicts the ceramic carrier 502 and the footprint 504 for the ceramic carrier 502. The ceramic carrier 502 and/or associated chip device may be fabricated using some or no chip-and-wire technologies (e.g., the chip device may be surface mounted and/or be of a hybrid design).

The ceramic carrier 502 may have solder-able DC and control pads 506 as well as solder-able or a gold plated notch for radio frequency (RF) inputs and RF outputs 508. In various embodiments, the ceramic carrier 502 has solder-able pads or one or more gold plated notches for RF inputs and RF outputs 508 as well as solder-able pads or one or more gold plated notches for bias and control signals. The ceramic carrier 502 may also comprise one or more vias to improve thermal performance.

The ceramic carrier 502 may be coupled to a base plate using epoxy or solder. Those skilled in the art will appreciate that there may be many ways to couple the ceramic carrier 502 to the base plate, including, but not limited to, spring press or screw mounting. The ceramic carrier 502 may also have a shield cover 510.

Figure 6:
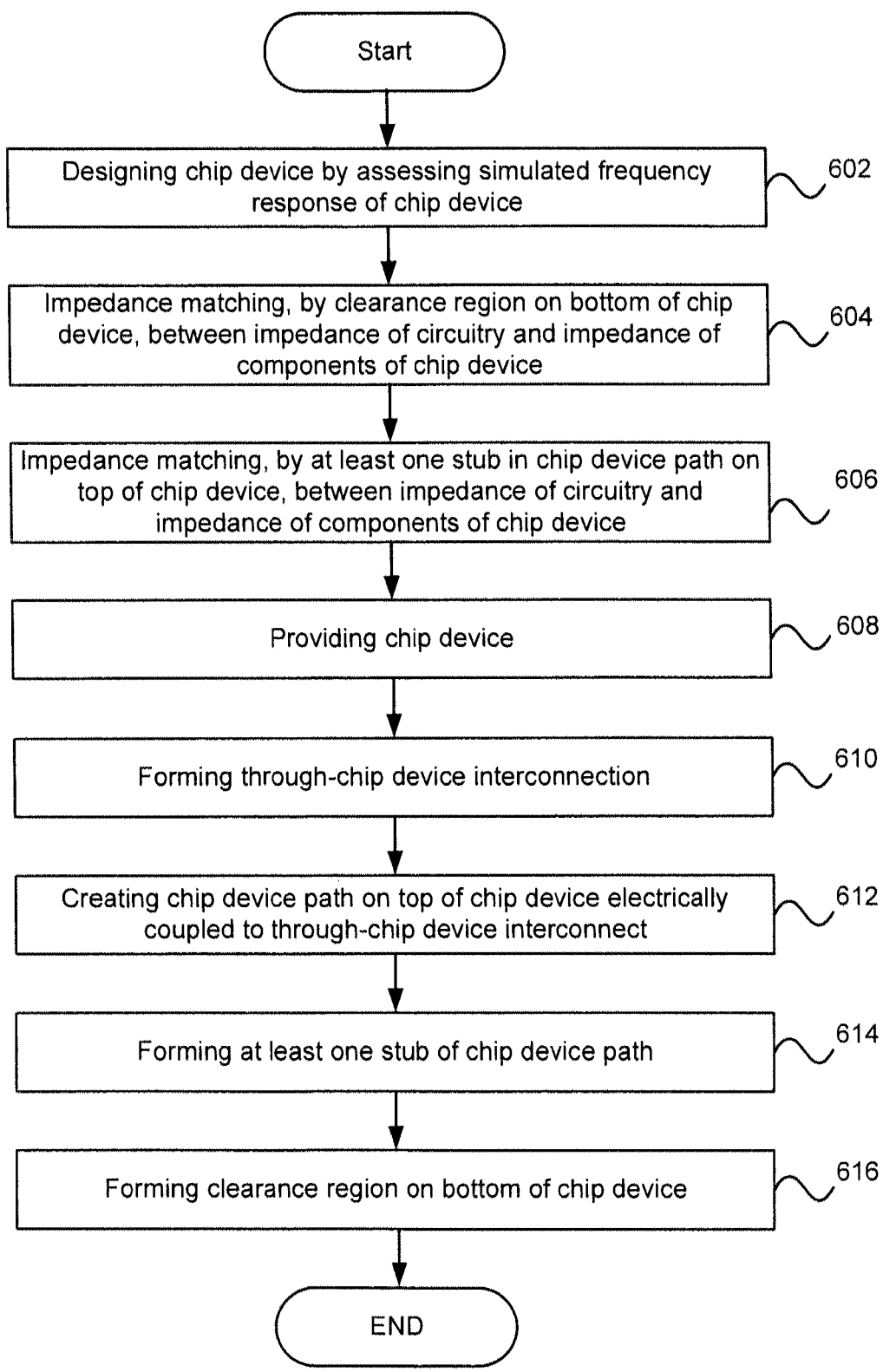
FIG. 6 is an exemplary method of designing and manufacturing an exemplary chip in some embodiments.

FIG. 6 is an exemplary method of designing and manufacturing an exemplary chip device in some embodiments. The chip device 302 may be designed in steps 602 to 606. The chip device 302 may be manufactured in steps 608-616. The chip device 302 may be designed by constructing a model of the chip device 302 in a computer-aided simulation program. In step 602, a simulation may be conducted to assess one or more simulated frequency responses of the model of the chip device 302.

In step 604, the computer-aided simulation program may perform impedance matching by modeling different sizes, shapes, locations, and numbers of tuning elements to improve performance. The tuning elements modeled may include the clearance region 316 on the bottom 306 of the chip device 302. In some embodiments, a variety of different sizes and shapes of the clearance region 316 may be modeled and a simulated frequency response measured to improve the performance of the modeled chip device 302.

In step 606, the computer-aided simulation program may perform impedance matching by modeling different sizes, shapes, locations, and numbers of other tuning elements to improve performance. The tuning elements modeled may include the tuning stubs 318 on the top 304 of the chip device 302. In some embodiments, a variety of different sizes, shapes, locations, and number of tuning stubs 318 may be modeled and a simulated frequency response measured to improve the performance of the modeled chip device 302.

As discussed herein, a chip device 302 may comprise a clearance region 316, one or more tuning stubs 318, or both. A designer may model a variety of different tuning elements, including different types, sizes, shapes, locations, and number of tuning elements, to tune the chip device 302 and/or a circuit.

In step 608, the chip device 302 is provided. In various embodiments, a substrate or other semiconductor is provided. In step 610, a through-chip interconnect 310 is formed. In one example, a via is made (using a computer numerical controlled drilling machine) and plated within the chip device 302.

In step 612, a chip device path 314 is created on the top 304 of the chip device 302. The chip device path 314 is electrically coupled with the through-chip interconnect 310. In step 614, at least one tuning stub 318 is formed along or within the chip device path 314. In various embodiments, the chip device path 314 and the one or more tuning stubs 318 are formed approximately simultaneously.

In step 616, a clearance region 316 is formed along the bottom 306 of the chip device 302. The clearance region 316 may be formed at any time. In some embodiments, the clearance region is formed along a substrate on which the chip device 302 is fabricated.

Those skilled in the art will appreciate that the fabrication of the through-chip interconnect 310, chip device path 314, clearance region 316, and tuning stubs 318 may be based on the chip design, modeling, and testing in steps 602-606.

As discussed herein, the chip device 302 may utilize an alumina carrier and may be coupled with a substrate or other semiconductor using a variety of different methods.

Figure 7:
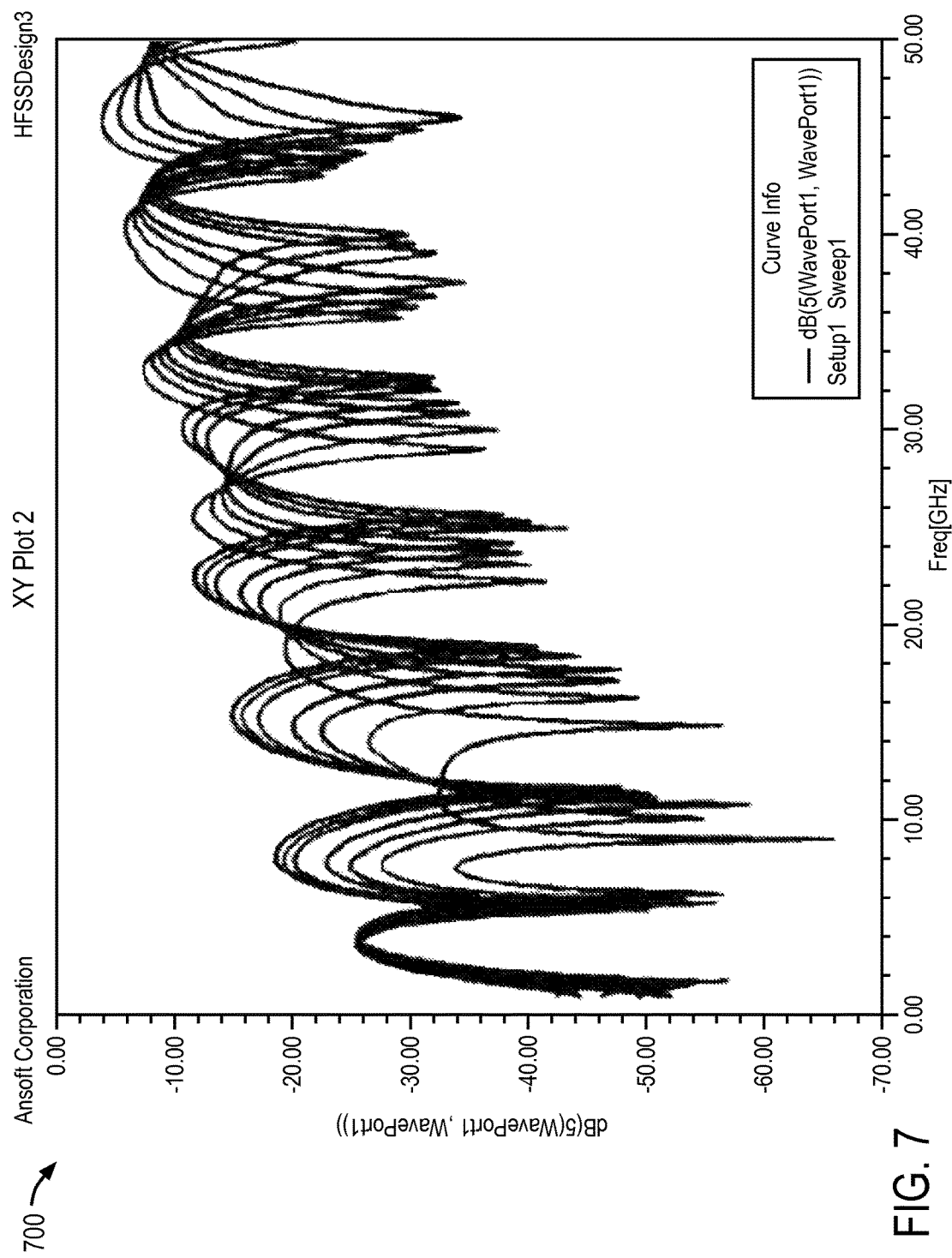
FIG. 7 is a graph of simulated frequency responses of a simulation of an exemplary chip design in some embodiments.

FIG. 7 is a graph 700 of simulated frequency responses of a simulation of an exemplary chip design in some embodiments. In various embodiments, computer-aided design software may be used to simulate a circuit and obtain one or more frequency response from the test data. Once the parameters are programmed into the computer-aided design software, changes to the circuit may be tested to determine relative effect. Commonly used computer-aided design software may include, but is not limited to, AWR Microwave Office™, Ansys' Ansoft High Frequency Structure Simulator™, Agilent Advanced Design System (ADS)™. In one example, the designer may model a nature of carrier, nature of system, properties, and desired frequencies to see how the interconnection behaves and to improve performance.

Figure 11:
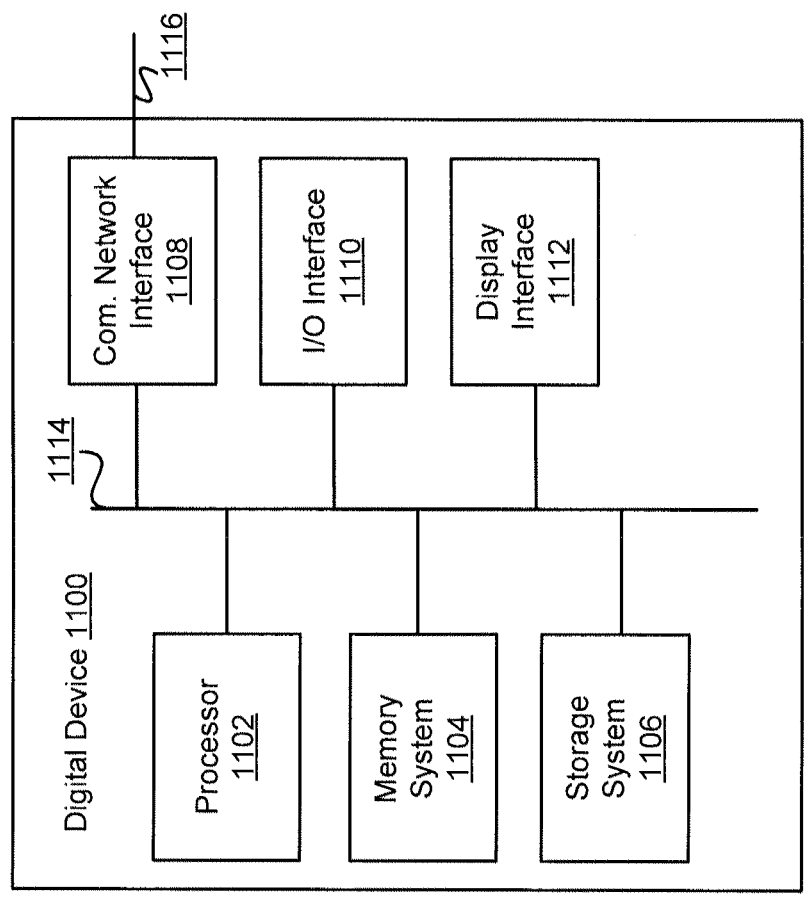
FIG. 11 is a block diagram of an exemplary digital device.

In some embodiments, a digital device such as the one described regarding FIG. 11 is used to design all or part of the chip device (e.g., by modeling all or a part of the circuit and measuring frequency response of different design choices). A digital device is any device with a processor and memory (e.g., a computer).

Those skilled in the art will appreciate that such computer-aided design software may be used to determine the various impedances associated with a circuit and/or components of the circuit. By using computer-aided design software, the electrical circuit may be modeled, and the effects of different sizes and shapes of the clearance region and/or the tuning stubs may be measured. As a result, the chip device may be "tuned" such that the size and shape of the clearance region and/or the size, shape, location, and number of tuning stubs may be selected for optimization and/or reduction of impedance mismatch.

By including both a clearance region and one or more tuning elements, the chip designer may have a greater number of design choices and, therefore, greater flexibility to meet performance objectives in view of electrical, physical, or financial constraints. FIG. 7 depicts a graph which depicts a number of different frequency responses for different sizes and shapes of clearance regions. In some embodiments, it is desireable to have a frequency response that is −10 dB or less. In FIG. 7, a designer may have a large number of design choices for different sizes of clearance regions up to approximately 32 GHz (i.e., the point in the graph which approximately reaches −10.00 dB along the y-axis).

Those skilled in the art will appreciate that many aspects of the circuit may be altered to improve performance. In some embodiments, many different aspects of the circuit may be modified to reduce impedance mismatch. For example, the width and length of the chip device path at the top of the chip device may affect impedance mismatch. Further, proximity of an input port, the pass-through interconnect, and/or the chip device path to other input ports or traces may affect the capacitance and/or inductance of the circuit (i.e., impacting impedance mismatch of the circuit, particularly at higher frequencies). By including one or more tuning elements, the designer may have flexibility to alter the size, shape, location, and materials of many aspects of the circuit to meet performance goals.

Modeling using this approach may also save a designer time. In view of graph 700, those skilled in the art will appreciate that a well-tuned design may not be necessary for frequencies from 5-14 GHz.

In various embodiments, a designer may generate tables of frequency responses optimized for a given carrier at different frequency bands. The tables may also indicate the desired size, shape, type, and number of tuning elements. Subsequently, the designer may not need computer-aided design software to model the chip device but rather simple tables.

It is apparent that the chip device may be optimized or improved through this design process. Further, those skilled in the art will appreciate that the use of tuning elements may allow for the modeling, measurement, and improvement of many systems and subsystems that include or communicate with the chip device including the tuning elements.

Figure 8:
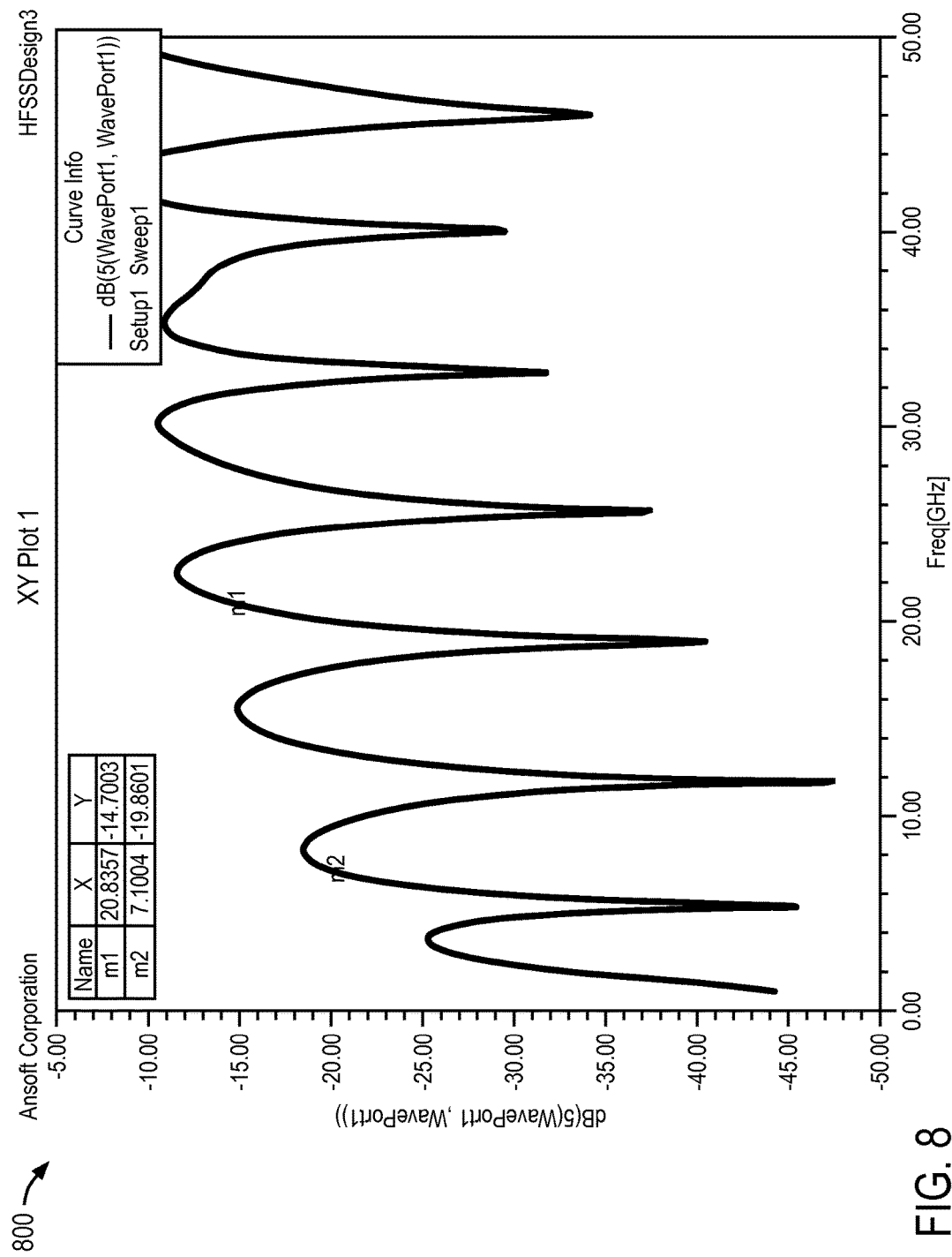
FIG. 8 is a graph of a simulated frequency response of a simulation of an exemplary chip design in some embodiments.

FIG. 8 is a graph 800 of a simulated frequency response of a simulation of an exemplary chip design in some embodiments. Like FIG. 7, FIG. 8 is a graph that shows variation in return loss of a tested ground clearance. In this example, the tested ground clearance indicates a satisfactory response (e.g., −10 dB or less) for frequencies less than approximately 42 GHz.

Those skilled in the art will appreciate that the designer may optimize the physical characteristics of the chip design (e.g., for less costly chips) while meeting performance goals. Multiple different tuning elements may allow the designer more options to meet objectives. In one example, the designer may adjust and test different sizes and shapes of the clearance region, tuning stubs, as well as different locations of input and output ports.

Figure 9:
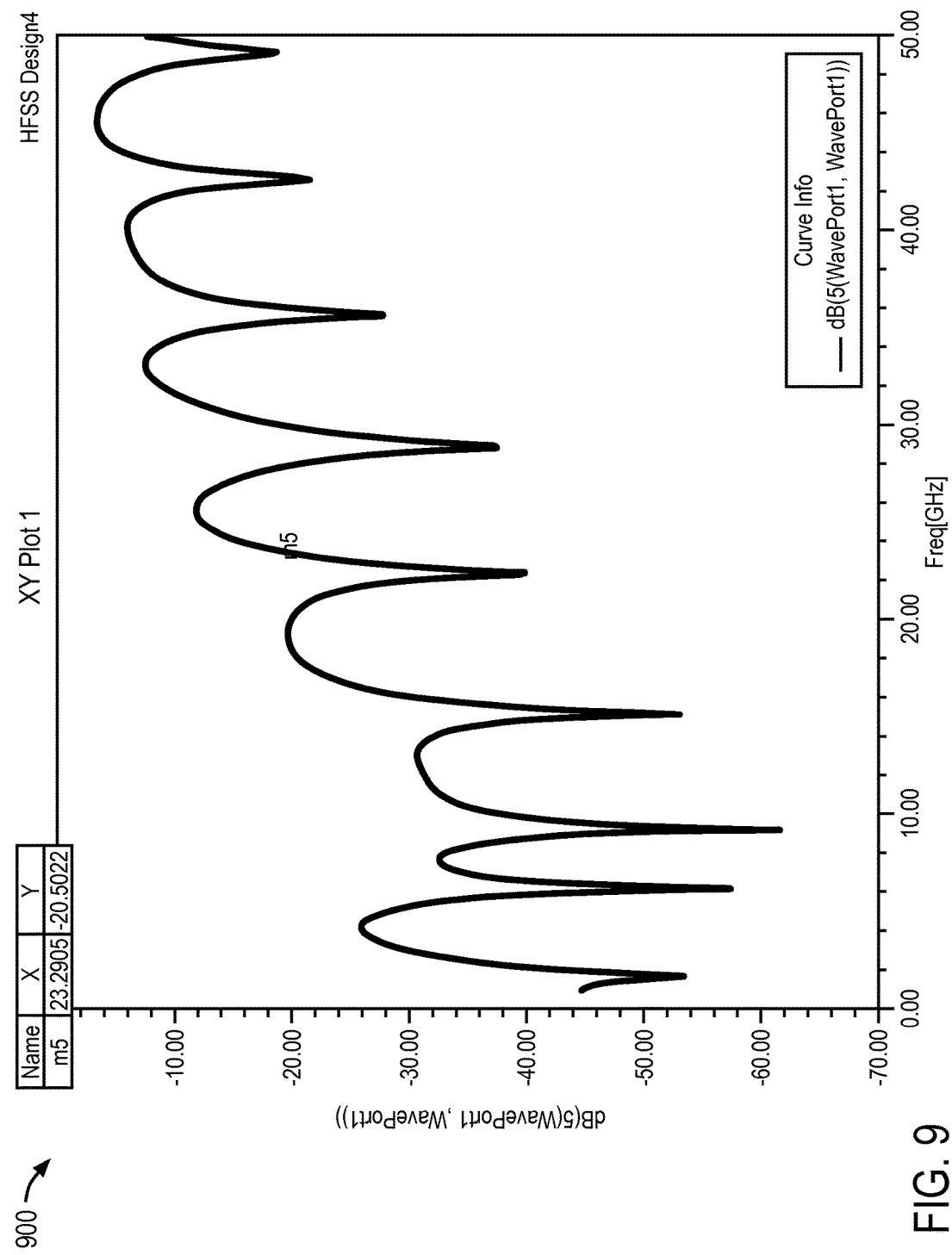
FIG. 9 is another graph of a simulated frequency response of a simulation of an exemplary chip design in some embodiments.
Figure 10:
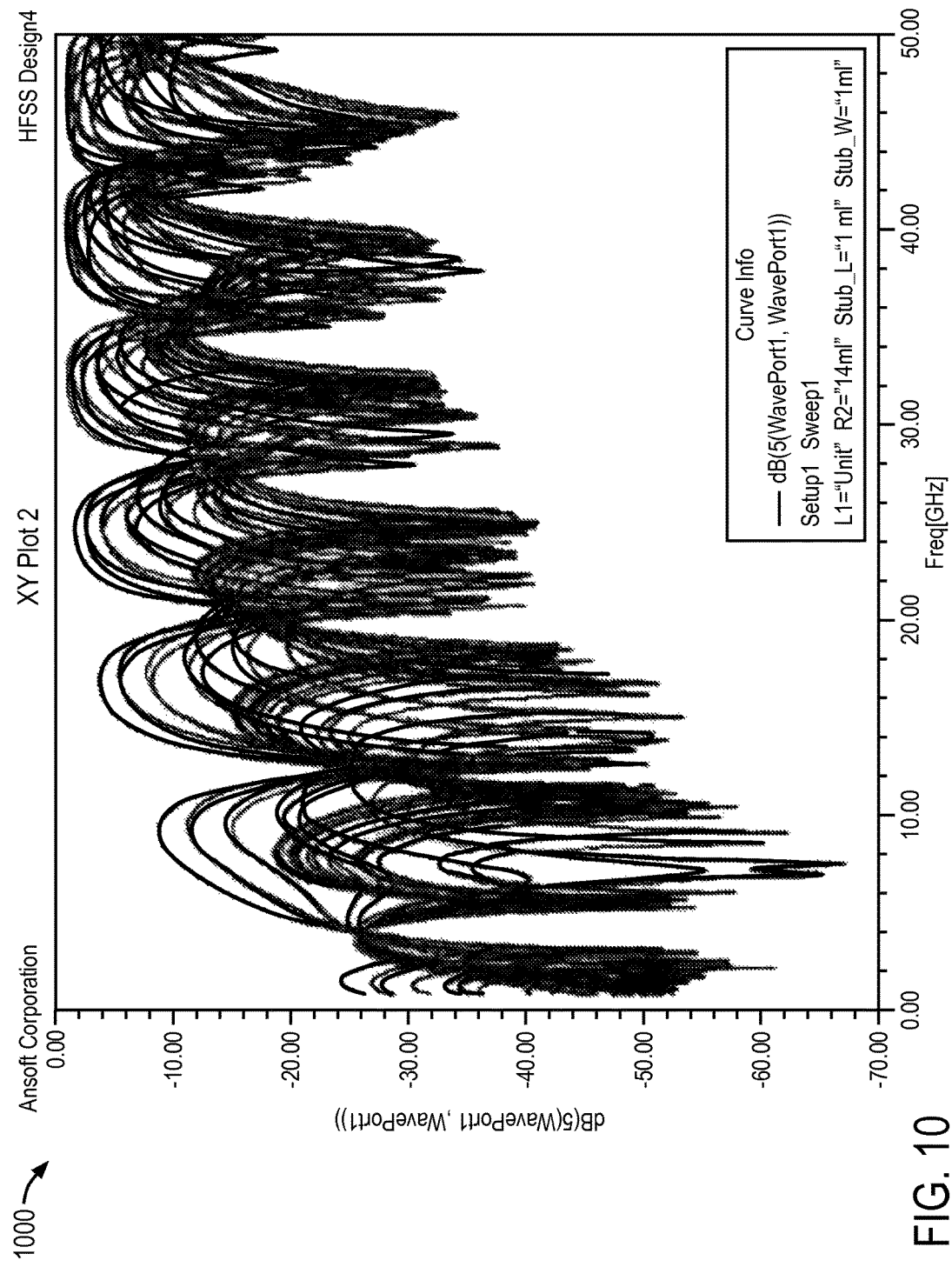
FIG. 10 is another graph of simulated frequency responses of a simulation of an exemplary chip design in some embodiments.

FIG. 9 is another graph 900 of a simulated frequency response of a simulation of an exemplary chip design in some embodiments. FIGS. 9 and 10 show the return loss tuning obtained by varying the clearance region and the tuning stubs simultaneously. It can be seen from FIG. 9 that the −20 dB return loss for two transitions has been extended to >23 dB thus demonstrating the effectiveness of the methodology.

The graph 900 also shows that approximately from 7 to 18 GHz, the frequency response is better than −30 dB which may reflect excellent performance.

FIG. 10 is another graph 1000 of simulated frequency responses of a simulation of an exemplary chip design in some embodiments. The graph 1000 shows that there are several design choices that provide a frequency response of −10 dB or less while obtaining frequencies in excess of 38 GHz. Those skilled in the art will appreciate that a variety of different sizes, shapes, and locations of one or more different tuning elements may be modeled and evaluated using computer-aided design software. As such, the designer may have a variety of choices of chip design (e.g., choice of tuning feature(s), size and shape of tuning feature(s), location of ports, size and shape of wires or traces, and the like). The designer may also be able to quickly evaluate a variety of options (e.g., different sizes of clearance regions and tuning stubs). Further, the designer may be able to design chip devices using affordable methodologies and technologies that were previously unavailable at the desired frequency ranges.

FIG. 11 is a block diagram of an exemplary digital device 1100. The digital device 1100 comprises a processor 1102, a memory system 1104, a storage system 1106, a communication network interface 1108, an I/O interface 1110, and a display interface 1112 communicatively coupled to a bus 1114. The processor 1102 is configured to execute executable instructions (e.g., programs). In some embodiments, the processor 1102 comprises circuitry or any processor capable of processing the executable instructions.

The memory system 1104 is any memory configured to store data. Some examples of the memory system 1104 are storage devices, such as RAM or ROM. The memory system 1104 can comprise the ram cache. In various embodiments, data is stored within the memory system 1104. The data within the memory system 1104 may be cleared or ultimately transferred to the storage system 1106.

The storage system 1106 is any storage configured to retrieve and store data. Some examples of the storage system 1106 are flash drives, hard drives, optical drives, and/or magnetic tape. In some embodiments, the digital device 1100 includes a memory system 1104 in the form of RAM and a storage system 1106 in the form of flash data. Both the memory system 1104 and the storage system 1106 comprise computer readable media which may store instructions or programs that are executable by a computer processor including the processor 1102.

The communication network interface (communications network interface) 1108 can be coupled to a network via the link 1116. The communication network interface 1108 may support communication over an Ethernet connection, a serial connection, a parallel connection, or an ATA connection, for example. The communication network interface 1108 may also support wireless communication (e.g., 802.11 a/b/g/n, WiMax). It will be apparent to those skilled in the art that the communication network interface 1108 can support many wired and wireless standards.

The optional input/output (I/O) interface 1110 is any device that receives input from the user and output data. The optional display interface 1112 is any device that is configured to output graphics and data to a display. In one example, the display interface 1112 is a graphics adapter.

It will be appreciated by those skilled in the art that the hardware elements of the digital device 1100 are not limited to those depicted in FIG. 11. A digital device 1100 may comprise more or less hardware elements than those depicted. Further, hardware elements may share functionality and still be within various embodiments described herein. In one example, encoding and/or decoding may be performed by the processor 1102 and/or a co-processor located on a GPU (i.e., Nvidia®).

The above-described functions and components can be comprised of instructions that are stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used without departing from the broader scope of the present invention. Therefore, these and other variations upon the exemplary embodiments are intended to be covered by the present invention(s).

The invention claimed is:

1. A microwave radio subsystem, the microwave radio subsystem comprising:
    a chip device having a first side, a second side opposite the first side, and a via through the chip device from the first side to the second side, the chip device configured to process microwave frequency signals;
    an electrical trace on the second side of the chip device;
    an electrical path on the first side of the chip device, the electrical path including one or more tuning stubs, each tuning stub having a first size, a first shape, and a first location, the first size, the first shape, and the first location controlling a first impedance of the electrical path;
    an electrical through-chip device interconnect configured to provide an electrical connection between the electrical trace on the second side of the chip device and the electrical path on the first side of the of the chip device, the electrical through-chip device interconnect having a first end coupled to the electrical path and a second end coupled to the electrical trace; and
    a clearance region disposed around a reference region on the second side of the chip device and not disposed on the first side of the chip device, the clearance region having a second size and a second shape, the second size and the second shape controlling a second impedance of the clearance region, the first size, the first shape and the first location of the one or more tuning stubs, and the second size and the second shape of the clearance region being selected to substantially reduce impedance mismatch between the electrical trace and the electrical path and to reduce return loss of the microwave frequency signals.

2. The microwave radio subsystem of claim 1, wherein the shape of at least one of the one or more tuning stubs is substantially circular.

3. The microwave radio subsystem of claim 1, wherein the shape of at least one of the one or more tuning stubs is substantially ovoid.

4. The microwave radio subsystem of claim 1, wherein the electrical through-chip device interconnect comprises a pass-through via.

5. The microwave radio subsystem of claim 1, wherein the chip device comprises an alumina package.

6. The microwave radio subsystem of claim 1, wherein the first impedance matches a component impedance of a component coupled to the electrical path.

7. The microwave radio subsystem of claim 1, wherein the shape of at least one of the one or more tuning stubs is substantially rectangular.

8. The microwave radio subsystem of claim 1, wherein the shape of at least one of the one or more tuning stubs is substantially square.

9. The microwave radio subsystem of claim 1, wherein the clearance region is substantially circular or substantially ovoid.

10. The microwave radio subsystem of claim 1, wherein at least one of the one or more tuning stubs comprises two opposing tuning stubs located on opposite sides of the electrical path on the first side of the chip device.

11. A chip device, the chip device comprising:
    a first side, a second side opposite the first side, and a via through the chip device from the first side to the second side, the chip device configured to process microwave frequency signals;
    an electrical path on the first side of the chip device, the electrical path including one or more tuning stubs, each tuning stub having a first size, a first shape, and a first location, the first size, the first shape, and the first location controlling a first impedance of the electrical path;
    an electrical trace on the second side of the chip device;
    a reference region;
    a clearance region disposed around the reference region and not disposed on the first side of the chip device, the clearance region having a second size and a second shape, the second size and the second shape controlling a second impedance of the clearance region, the first size, the first shape and the first location of the one or more tuning stubs and the second size and the second shape of the clearance region being selected to substantially reduce impedance mismatch between the electrical trace and the electrical path and to reduce return loss of the microwave frequency signals; and
    an electrical through-chip device interconnect configured to provide an electrical connection between the electrical trace on the second side of the chip device and the electrical path on the first side of the chip device, the electrical through-chip device interconnect having a first end coupled to the electrical path and a second end coupled to the electrical trace.

12. The chip device of claim 11, wherein the shape of at least one of the one or more tuning stubs is substantially rectangular.

13. The chip device of claim 11, wherein the shape of at least one of the one or more tuning stubs is substantially square.

14. The chip device of claim 11, wherein the shape of at least one of the one or more tuning stubs is substantially circular.

15. The chip device of claim 11, wherein the electrical through-chip device interconnect comprises a pass-through via.

16. The chip device of claim 11, wherein the chip device comprises an alumina package.

17. The chip device of claim 11, wherein the clearance region is substantially circular or substantially ovoid.

18. The chip device of claim 11, wherein at least one of the one or more tuning stubs comprises two opposing tuning stubs located on opposite sides of the electrical path on the first side of the chip device.

19. The chip device of claim 11, wherein the shape of at least one of the one or more tuning stubs is substantially ovoid.

20. The chip device of claim 11, wherein the first impedance matches a component impedance of a component coupled to the electrical path.

\* \* \* \* \*